(12) United States Patent
Mizuno

(10) Patent No.: US 8,287,148 B2
(45) Date of Patent: Oct. 16, 2012

(54) LIGHT EMITTING MODULE

(75) Inventor: Masanobu Mizuno, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 80 days.

(21) Appl. No.: 12/849,871

(22) Filed: Aug. 4, 2010

(65) Prior Publication Data

US 2011/0032702 A1   Feb. 10, 2011

(30) Foreign Application Priority Data

Aug. 7, 2009   (JP) ................. 2009-185001

(51) Int. Cl.
*F21V 9/00* (2006.01)

(52) U.S. Cl. ........ 362/247; 362/800; 362/231; 362/230; 362/249.02

(58) Field of Classification Search .................. 362/231, 362/230, 249.02, 800, 247
See application file for complete search history.

(56) References Cited

U.S. PATENT DOCUMENTS

| | | | |
|---|---|---|---|
| 7,350,933 B2 * | 4/2008 | Ng et al. ........................ | 362/84 |
| 7,654,681 B2 * | 2/2010 | Kim et al. .................... | 362/97.4 |
| 7,731,377 B2 * | 6/2010 | Moriya et al. ............... | 362/97.3 |
| 7,845,826 B2 * | 12/2010 | Aylward et al. .............. | 362/243 |
| 2005/0269582 A1 | 12/2005 | Mueller et al. | |
| 2006/0232964 A1 * | 10/2006 | Hoshi et al. .................. | 362/231 |

FOREIGN PATENT DOCUMENTS

| | | |
|---|---|---|
| JP | 2006-005367 A | 1/2006 |
| JP | 2007-179969 A | 7/2007 |
| JP | 2008-010228 A | 1/2008 |

* cited by examiner

*Primary Examiner* — Anabel Ton
(74) *Attorney, Agent, or Firm* — Osha Liang LLP

(57) ABSTRACT

A light emitting module includes: light emitting elements arranged with a distance interposed therebetween, each of the light emitting elements includes: a first light emitting surface, and second light emitting surfaces bordering the first light emitting surface; optical wavelength conversion members that convert a wavelength of light emitted from corresponding light emitting elements; and a reflecting member that extends from a gap between adjacent light emitting elements to a gap between the adjacent optical wavelength conversion members so as to surround each of the light emitting elements and so as to separate the adjacent light emitting elements. The reflecting member includes reflecting surfaces that respectively face each of the second light emitting surfaces. Each of the reflecting surfaces is inclined such that a distance between the reflecting surface and the second light emitting surface that the reflecting surface faces is gradually increased toward the optical wavelength conversion member.

5 Claims, 7 Drawing Sheets

P-P

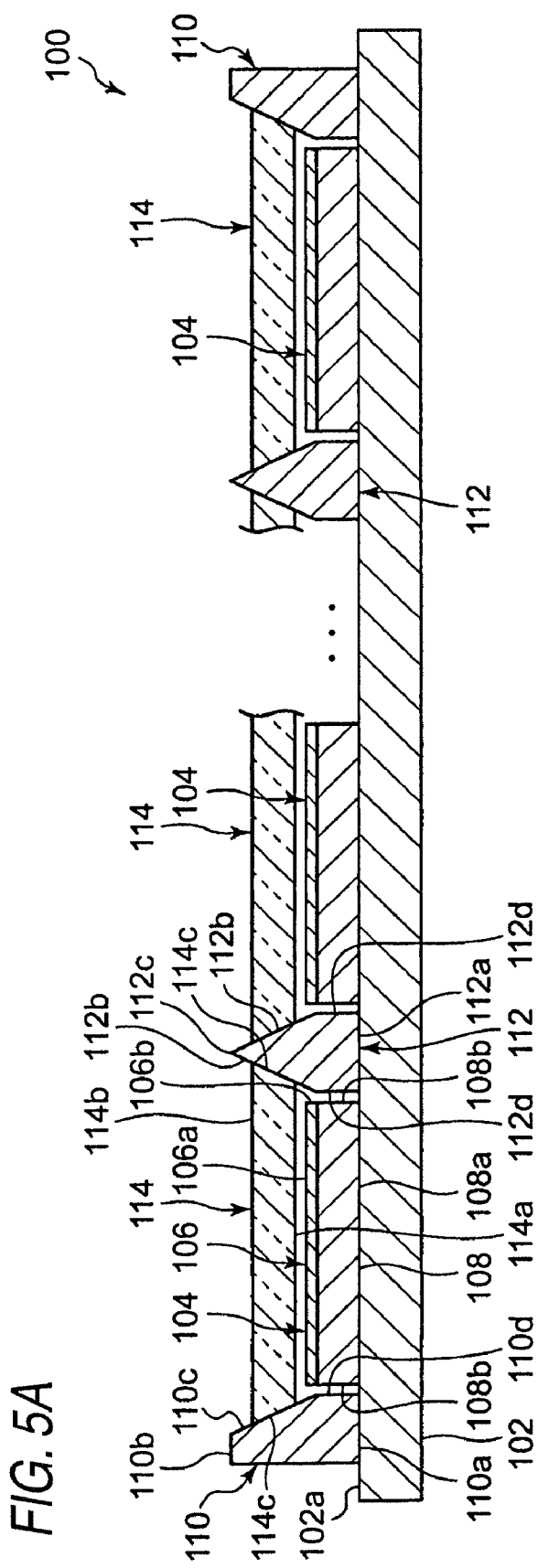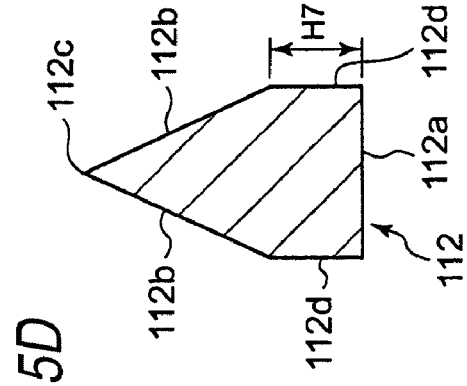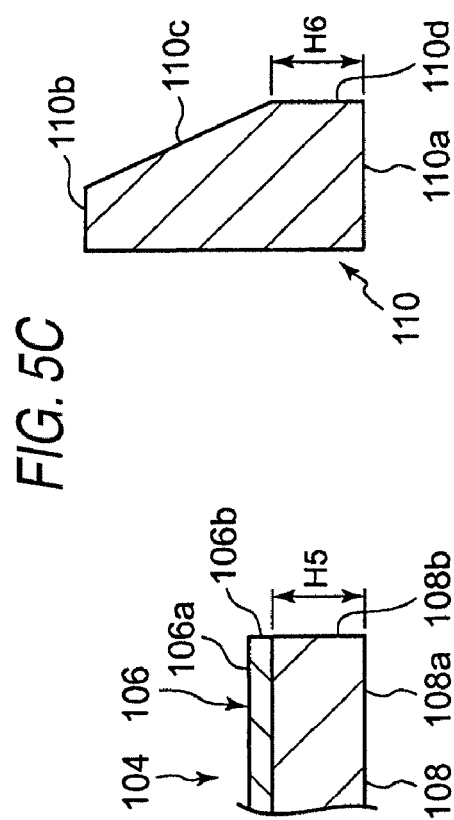

LIGHT EMITTING MODULE

BACKGROUND OF INVENTION

1. Field of the Invention

The present disclosure relates to a light emitting module, and more particularly, to a light emitting module that includes a light emitting element and an optical wavelength conversion member converting the wavelength of light emitted from the light emitting element and emitting light having the converted wavelength.

2. Related Art

In the past, there has been a technique that obtains a light emitting module. The light emitting module emits light, whose color is different from the color of light emitted from the light emitting element such as a light Emitting Diode (LED), using phosphors or the like that convert the wavelength of light that is emitted from a light emitting element. Meanwhile, there has been proposed a technique that disposes a ceramic layer, which contains, for example, a wavelength conversion material, on the path of light emitted from a light emitting layer, in order to increase conversion efficiency when the wavelength of light is converted (for example, see JP-A-2006-5367). Meanwhile, in order to improve visibility without directing glare at a preceding vehicle, there has been a vehicle lamp that forms an irradiation pattern selected from a plurality of irradiation patterns by controlling the turning on/off of, for example, a plurality of LEDs (for example, see JP-A-2007-179969).

Further, for example, in order to obtain necessary light distribution characteristics, there has been proposed a vehicle lamp with small size and small weight that includes a planar integrated light source, a mask, and phosphors. The planar integrated light source includes LEDs, which are arranged on the surface thereof. The mask includes openings through which a light emitting portion is exposed to the outside. The openings of the mask are filled with the phosphors (for example, see JP-A-2008-10228).

For example, in a light emitting element where a substrate used for crystal growth and made of sapphire or the like is used as it is, light guided by the substrate is emitted from the side surface of the light emitting element. If the wavelength of the light emitted from the side surface cannot be appropriately converted, there occurs so-called color separation where the color of light of the light emitting element seen from above is different from that of light of the light emitting element seen from the side. In this connection, as described in, for example, JP-A-2008-10228, there is considered a technique where light emitted from the side surface of a light emitting element is reflected by a reflecting surface facing the side surface in a light emitting direction in order to avoid color separation. However, it is difficult to provide a wavelength conversion material in a method, which is disclosed in JP-A-2008-10228, of filling the openings of the mask with phosphors and hardening the phosphors when the wavelength of light emitted from the light emitting element is converted by a plate-like member such as a ceramic layer described in, for example, JP-A-2006-5367.

SUMMARY OF INVENTION

Exemplary embodiments of the present invention address the above disadvantages and other disadvantages not described above. However, the present invention is not required to overcome the disadvantages described above.

In an illustrative aspect, one or more embodiments of the present invention provide a light emitting module that appropriately converts the wavelength of light emitted from a light emitting element by a plate-like optical wavelength conversion material while efficiently utilizing the light emitted from the light emitting element.

According to one or more illustrative aspects, there is provided a light emitting module. The light emitting module comprises: light emitting elements arranged with a distance interposed therebetween, each of the light emitting elements including: a first light emitting surface and second light emitting surfaces bordering the first light emitting surface; plate-like optical wavelength conversion members each of which converts a wavelength of light emitted from the corresponding light emitting element; and a reflecting member that extends from a gap between the adjacent light emitting elements to a gap between the adjacent optical wavelength conversion members to surround the light emitting elements so as to separate the adjacent light emitting elements. The reflecting member includes reflecting surfaces that face the second light emitting surfaces. Each of the reflecting surfaces is inclined such that a distance between the reflecting surface and the second light emitting surface is gradually increased toward the optical wavelength conversion member.

According to this aspect, even when a plurality of semiconductor light emitting elements are arranged parallel to each other, it may be possible to reflect light, which is emitted from the second light emitting surface of the semiconductor light emitting element, toward the incident surface of the optical wavelength conversion member. Accordingly, it may be possible to appropriately convert the wavelength of the light, which is emitted from the light emitting element, by a plate-like optical wavelength conversion material while also efficiently utilizing the light emitted from the second light emitting surface.

The reflecting member may be made of silicon. If the reflecting member is made of silicon, it may be possible to easily form a reflecting surface, which is inclined as described above to increase reflectance, using a method such as etching.

According to one or more illustrative aspects, the reflecting member further comprises: vertical surfaces each of which borders the corresponding reflecting surface and extends in a direction substantially perpendicular to the first light emitting surface such that the optical wavelength conversion member is closer to the reflecting surface than the vertical surface.

Therefore, it may be possible to reduce low-luminance portions formed between the light emitting element and the reflecting member, and to increase the uniformity of luminance.

According to one or more illustrative aspects, an end of the reflecting member protrudes from the optical wavelength conversion members.

According to the above aspect, it may be possible to more clearly divide the emission surfaces of the optical wavelength conversion members. Accordingly, even when control is performed so as to turn on a part of, for example, a plurality of light emitting elements, it may be possible to clarify a boundary between a turning-on region and a turning-off region.

According to one or more illustrative aspects, each of the optical wavelength conversion members is placed on the corresponding reflecting surface of the reflecting member.

Accordingly, it may be possible to make the reflecting surface function as a surface on which the optical wavelength conversion member is placed. Therefore, it may be possible to reflect the light, which is guided in the optical wavelength conversion member, toward the emission surface of the optical wavelength conversion member. As a result, it may be possible to more effectively utilize the light that is emitted from the light emitting element.

According to one or more embodiments of the invention, it may be possible to appropriately convert the wavelength of light emitted from a light emitting element by a plate-like optical wavelength conversion material while efficiently utilizing the light emitted from the light emitting element.

Other aspects and advantages of the invention will be apparent from the following description, the drawings and the claims.

BRIEF DESCRIPTION OF DRAWINGS

FIG. 5A is a cross-sectional view of a light emitting module according to a fourth embodiment of the invention.

FIG. 5B is an enlarged view of a semiconductor light emitting element that is mounted on a mounting board.

FIG. 5C is an enlarged view of a reflecting member.

FIG. 5D is an enlarged view of the other reflecting member.

DETAILED DESCRIPTION

Exemplary embodiments of the invention will be described in detail below with reference to drawings.

First Embodiment

Figure 1:
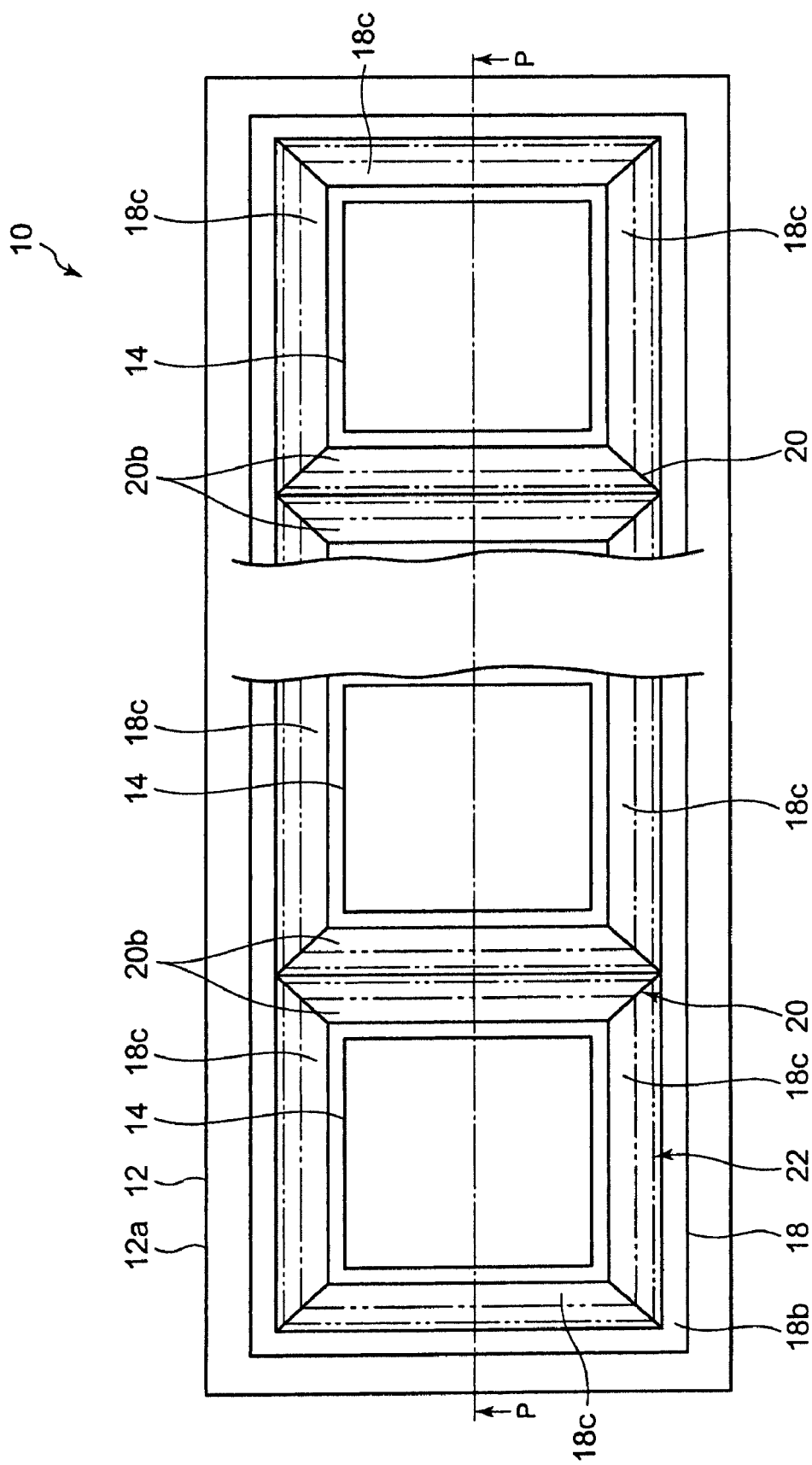
FIG. 1 is a top view of a light emitting module according to a first embodiment of the invention.
Figure 2:
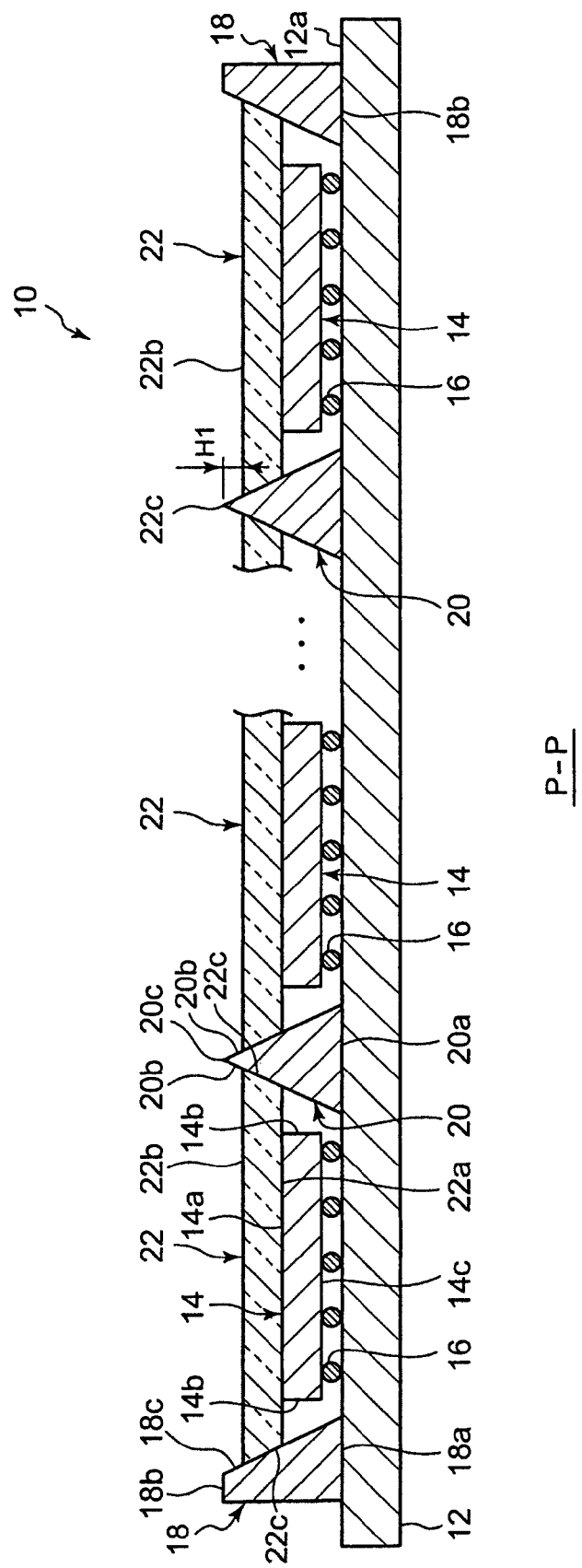
FIG. 2 is a cross-sectional view taken along a line P-P of FIG. 1.

FIG. 1 is a top view of a light emitting module 10 according to a first embodiment and FIG. 2 is a cross-sectional view taken along a line P-P of FIG. 1. The light emitting module 10 will be described below with reference to FIGS. 1 and 2.

The light emitting module 10 includes a mounting board 12, semiconductor light emitting elements 14, a reflecting member 18, reflecting members 20, and optical wavelength conversion members 22. The semiconductor light emitting element 14 is formed in the shape of a plate having six surfaces, that is, a first light emitting surface 14a that is a main light emitting surface having the square shape, four second light emitting surfaces 14b, each of which borders the first light emitting surface 14a at a right angle, and a back surface 14c opposite to the first light emitting surface 14a. Meanwhile, the first light emitting surface 14a may border the second light emitting surface 14b at a predetermined angle other than a right angle.

The mounting board 12 is made of a material having high thermal conductivity such as AlN in the shape of a flat plate. The plurality of semiconductor light emitting elements 14 are mounted on a mounting surface 12a of the mounting board 12 so that the respective first light emitting surfaces 14a are parallel to the mounting surface 12a. The mounting board 12 has an area large enough for the plurality of semiconductor light emitting elements 14 to be mounted. In the first embodiment, the plurality of semiconductor light emitting elements 14 are arranged parallel to each other with a distance therebetween. However, a plurality of mounting boards 12 may be arranged parallel to each other so as to form a plurality of lines, that is, the plurality of mounting boards 12 may be arranged parallel to each other on a plane.

A so-called flip-chip element is employed as the semiconductor light emitting element 14. Electrodes (not shown) are provided on the mounting surface 12a of the mounting board 12, and back surfaces 14c of the plurality of semiconductor light emitting elements 14 are connected to the electrodes through Au bumps 16. The electrodes connect the plurality of semiconductor light emitting elements 14 with an electric power source through a switching circuit so as to independently supply current to each of the plurality of semiconductor light emitting elements 14. Accordingly, it may be possible to independently control the turning-on of each of the plurality of semiconductor light emitting elements 14 or to control light emitted from each of the plurality of semiconductor light emitting elements. Meanwhile, the plurality of semiconductor light emitting elements 14 may be electrically connected to each other in parallel and series by the electrodes provided on the mounting surface 12a so that electric power can be supplied to the plurality of semiconductor light emitting elements 14 at the same time.

The semiconductor light emitting element 14 is formed of an LED element. A blue LED, which mainly emits blue-wavelength light, is employed as the semiconductor light emitting element 14 in the first embodiment. Specifically, the semiconductor light emitting element 14 is formed of an InGaN-based LED element that is formed by growing the crystal of an InGaN-based semiconductor layer. Meanwhile, the material of the semiconductor light emitting element 14 is not limited thereto. For example, any one of InN, AlGaN, and AlN may be used.

The semiconductor light emitting element 14 is formed of a chip having a size of, for example, 1 mm square, and is formed so that the center wavelength of emitted blue light is 470 nm. Those skilled in the art will appreciate that the structure of the semiconductor light emitting element 14 and the wavelength of light emitted from the semiconductor light emitting element are not limited to the above-mentioned structure and wavelength. A semiconductor light emitting element, which mainly emits light other than blue-wavelength light, may be employed as the semiconductor light emitting element 14.

A plurality of optical wavelength conversion members 22 are provided so as to correspond to the plurality of semiconductor light emitting elements 14, respectively. Each of the optical wavelength conversion members 22 is formed in the shape of a plate. The optical wavelength conversion members 22 are arranged parallel to each other so that incident surfaces 22a of the optical wavelength conversion members face the first light emitting surfaces 14a of the plurality of semiconductor light emitting elements 14, respectively. The incident surface 22a adheres to the first light emitting surface 14a, so that the optical wavelength conversion member 22 is fixed to the semiconductor light emitting element 14. In this case, an adhesive, such as a silicone-based adhesive, a sol-gel silica-based adhesive, a fluorine-based adhesive, or an inorganic glass-based adhesive, which is excellent in light resistance, is used. The optical wavelength conversion member 22 converts the wavelength of light emitted from the light emitting element 14 that faces the optical wavelength conversion members, respectively, and emit light having the converted wavelength.

The optical wavelength conversion member 22 is made of so-called light emitting ceramics or fluorescent ceramics, and may be obtained by sintering a ceramic base made of YAG (Yttrium Aluminum Garnet) powder that is a phosphor excited by blue light. Because methods of manufacturing optical wavelength conversion ceramics are well known, the detailed description thereof will be omitted herein. Meanwhile, the optical wavelength conversion member 22 is not limited to sintered ceramics, and may include, for example, an amorphous member, a polycrystalline member, and a single-crystalline member. The optical wavelength conversion member is not limited by the crystalline structure, and the like.

Further, a transparent member is employed as the optical wavelength conversion member 22. In the first embodiment, "transparent" means that the total light transmittance of light in a conversion wavelength range is 40% or more. As a result of the dedicated research and development of the inventor, it has been found that it may be possible to appropriately convert the wavelength of light in the optical wavelength conversion member 22 and to appropriately suppress the reduction in the intensity of light passing through the optical wavelength conversion member 22 in a transparent state where the total light transmittance of light in the conversion wavelength range is 40% or more. Accordingly, it may be possible to more efficiently convert the light, which is emitted from the semiconductor light emitting element 14, by making the optical wavelength conversion member 22 be in the transparent state.

Furthermore, the optical wavelength conversion member 22 is made of an inorganic material, which does not contain an organic binder, in order to improve durability as compared to that of an optical wavelength conversion member 22 that is made of an organic material such as an organic binder. For this reason, for example, electric power of 1 W (watt) or more may be applied to the light emitting module 10, so that it may be possible to increase the luminance, intensity, and flux of the light that is emitted from the light emitting module 10. Meanwhile, a binder may be contained in the optical wavelength conversion member 22.

The optical wavelength conversion member 22 converts the wavelength of blue light that is mainly emitted from the semiconductor light emitting element 14, and emits yellow light. For this reason, the light emitting module 10 emits white light, that is, combined light of blue light that is transmitted through the optical wavelength conversion member 22 as it is, and yellow light that is obtained by the wavelength conversion using the optical wavelength conversion member 22.

The semiconductor light emitting element 14 is formed by the single crystal growth of a semiconductor layer on a crystal growth substrate made of, for example, sapphire. The semiconductor light emitting element 14 of the first embodiment where the crystal growth substrate is not removed and remains is used. For this reason, light guided by the crystal growth substrate is also emitted from the side surface of the light emitting element. Further, light is also emitted from a portion of the semiconductor layer of the second light emitting surface 14b. Meanwhile, an element from which the crystal growth substrate has been removed may be used as the semiconductor light emitting element 14. If neither the wavelength of the light emitted from the first light emitting surface 14a, nor the wavelength of the light emitted from the second light emitting surface 14b, may also be appropriately converted as described above, there is a concern that so-called color separation will occur.

For this reason, the light emitting module 10 is provided with the reflecting member 18 in the first embodiment. The reflecting member 18 is formed in the shape of a rectangular frame, and has a quadrangular cross section. The reflecting member 18 is placed on the mounting surface 12a of the mounting board 12 so as to surround all of the plurality of the semiconductor light emitting elements 14. A lower surface 18a of the reflecting member 18 adheres to the mounting surface 12a, so that the reflecting member 18 is fixed to the mounting board 12. In this case, an adhesive, such as a silicone-based adhesive, a sol-gel silica-based adhesive, a fluorine-based adhesive, or an inorganic glass-based adhesive, which is excellent in light resistance, is used. The reflecting member 18 may be bonded to the mounting board 12 by solder bonding, surface activation bonding, anodic oxidation bonding, or the like.

The reflecting member 18 includes reflecting surfaces 18c on the inner surfaces thereof. The reflecting surfaces 18c face the second light emitting surfaces 14b except for the second light emitting surfaces 14b facing each other, among the respective second light emitting surfaces 14b of the plurality of semiconductor light emitting elements 14 that is arranged in a line. Accordingly, the reflecting surfaces 18c face the second light emitting surfaces 14b parallel to the arrangement direction of the semiconductor light emitting elements 14, among the respective second light emitting surfaces 14b of the plurality of semiconductor light emitting elements 14. Further, the reflecting surfaces also face the outer second light emitting surfaces 14b of the semiconductor light emitting elements 14 that are positioned on both ends.

The reflecting surfaces 18c are inclined to be separated from the second light emitting surfaces 14b facing the reflecting surfaces 18c as approaching an upper surface 18b of the reflecting member 18. In other words, the reflecting surface 18c is inclined such that a distance between the reflecting surface 18c and the second light emitting surface 14b is gradually increased from the lower surface 18a to the upper surface 18b.

If the reflecting surfaces 18c are formed as described above, it may be possible to reflect light, which is emitted from the second light emitting surfaces 14b of the semiconductor light emitting elements 14, toward the incident surfaces 22a of the optical wavelength conversion members 22. Accordingly, it may be possible to effectively utilize the light that is emitted from the second light emitting surfaces 14b, and to increase the luminance or intensity of light emitted from the light emitting module 10 as compared to when the reflecting surfaces 18c are not provided.

The reflecting member 20 extends from a gap formed between each pair of semiconductor light emitting elements 14 to a gap formed between a pair of optical wavelength conversion members 22, which faces each pair of semiconductor light emitting elements 14, so that the pair of semiconductor light emitting elements 14 adjacent to each other is partitioned. Because the plurality of semiconductor light emitting elements 14 are arranged in a line, the number of the reflecting members 20 is smaller than that of the semiconductor light emitting elements 14 by one. Meanwhile, even when the plurality of semiconductor light emitting elements 14 are arranged parallel to each other on a plane so as to form a plurality of lines, the reflecting member 20 is disposed between each pair of semiconductor light emitting elements 14 so that the pair of semiconductor light emitting elements 14 adjacent to each other is partitioned.

The reflecting member 20 is formed in the shape of a triangular prism that includes a lower surface 20a and a pair of reflecting surfaces 20b bordering the lower surface 20a at the same angle as side surfaces. The lower surface 20a adheres to the mounting surface 12a of the mounting board 12, so that the reflecting member 20 is fixed to the mounting board 12. The kinds of adhesives are the same as described above. Meanwhile, the reflecting member 20 may be bonded to the mounting board 12 by solder bonding, surface activation bonding, anodic oxidation bonding, or the like.

The pair of reflecting surfaces 20b faces the pair of semiconductor light emitting elements 14, which is divided by the reflecting member 20, respectively. Each of the pair of reflecting surfaces 20b is inclined to be separated from the second light emitting surface 14b facing the reflecting surface 20 as approaching an apex 20c where the pair of reflecting surfaces cross each other. Accordingly, even when the plurality of semiconductor light emitting elements 14 are mounted, it may be possible to suppress the formation of low-luminance portions between a pair of optical wavelength conversion members 22 adjacent to each other and to efficiently utilize the light that is emitted from each of the semiconductor light emitting elements 14. Meanwhile, the reflecting surfaces 20b may be formed to face the second light emitting surface 14b of at least one of the pair of semiconductor light emitting elements 14.

The reflecting member 20 is formed to protrude from the pair of optical wavelength conversion members 22 that is divided by the reflecting member 20. The height of a protruding portion of the reflecting member 20, that is, a protrusion height H1 between the apex 20c of the reflecting member 20 and an emission surface 22b of the optical wavelength conversion member 22 is in a range of about 1 to 100 μm. Meanwhile, the reflecting member 20 may be formed to protrude from one of the pair of optical wavelength conversion members 22 that is divided by the reflecting member 20.

Further, the pair of optical wavelength conversion members 22, which is divided by the reflecting member 20, is placed on the pair of reflecting surfaces 20b of the reflecting member 20, respectively. Furthermore, the optical wavelength conversion members 22 are also placed on the reflecting surfaces 18c of the reflecting member 18, respectively. The optical wavelength conversion members 22 adhere to, and are fixed to, the reflecting surfaces 18c and the reflecting surfaces 20b. The kinds of adhesives that may be used are the same as described above.

As approaching the emission surface 22b, the side surfaces 22c of the optical wavelength conversion member 22 are inclined to increase the distances between the side surfaces 22c and the middle of the optical wavelength conversion member 22 so that the optical wavelength conversion member 22 is placed on the reflecting surface 18c and the reflecting surface 20b. The inclined side surfaces 22c of the optical wavelength conversion member 22 are formed by dicing. The optical wavelength conversion member 22 is formed so that the inclination angle of each of four side surfaces 22c with respect to the incident surface 22a is equal to the inclination angle of the reflecting surface 18c with respect to the first light emitting surface 14a and the inclination angle of the reflecting surface 20b with respect to the first light emitting surface 14a. For this reason, when the optical wavelength conversion member 22 is placed on the reflecting surfaces 18c of the reflecting member 18 and the reflecting surfaces 20b of the reflecting members 20, the four side surfaces 22c of the optical wavelength conversion member 22 come into contact with the reflecting surfaces 18c of the reflecting member 18 and the reflecting surfaces 20b of the reflecting members 20, respectively.

Accordingly, it may be possible to reflect the light, which is guided in the optical wavelength conversion member 22 and reaches the side surface 22c, toward the emission surface 22b. Therefore, it may be possible to more effectively utilize the light that is emitted from the semiconductor light emitting element 14. Meanwhile, one of the pair of optical wavelength conversion members, which is divided by the reflecting member 20, may be placed on one of the pair of reflecting surfaces 20b of the reflecting member 20.

The reflecting members 18 and 20 are integrally made of silicon. The upper surface 18b of the reflecting member 18 is substantially flush with the apexes 20c of the reflecting members 20. When the reflecting members 18 and 20 are manufactured, first, masking is formed on portions, which correspond to the upper surface 18b of the reflecting member 18 and the apexes 20c of the reflecting members 20, of a flat plate-like substrate made of single-crystalline silicon. Then, wet etching is performed from the side of the substrate on which masking has been formed, so that the reflecting surfaces 18c and 20b are formed.

If the reflecting members 18 and 20 are made of silicon, it may be possible to form the reflecting surfaces 18c and 20b with an accurate inclination angle of about 54.7° between the upper surface 18b and the reflecting surfaces 18c and 20b. Further, if the reflecting members 18 and 20 are made of silicon, it may be possible to easily make the surfaces of the reflecting members be smooth and to achieve high reflection efficiency. After the reflecting surfaces 18c and 20b are formed, the masking is removed. Those skilled in the art will appreciate that the reflecting members 18 and 20 may be made of a material other than silicon.

A reflecting film having a reflectance of 85% or more is formed on the surfaces of the reflecting members 18 and 20 by depositing, for example, aluminum or silver on the surfaces of the reflecting members. In order to achieve the supply of appropriate current, the reflecting film is formed at a portion that is higher than the lower surface 18a of the reflecting member 18 by 5 μm or more and at a portion that is higher than the lower surface 20a of the reflecting member 20 by 5 μm or more.

Meanwhile, the reflecting members 18 and 20 may be made of a material other than silicon. The reflecting member 18 may be formed so that the inclination angle of the reflecting surface 18c with respect to the upper surface 18b is in a range of about 20 to 70°. The reflecting member 20 may be formed so that the inclination angle of the reflecting surface 20b with respect to the upper surface 18b is in a range of about 20 to 70°.

Second Embodiment

Figure 3:
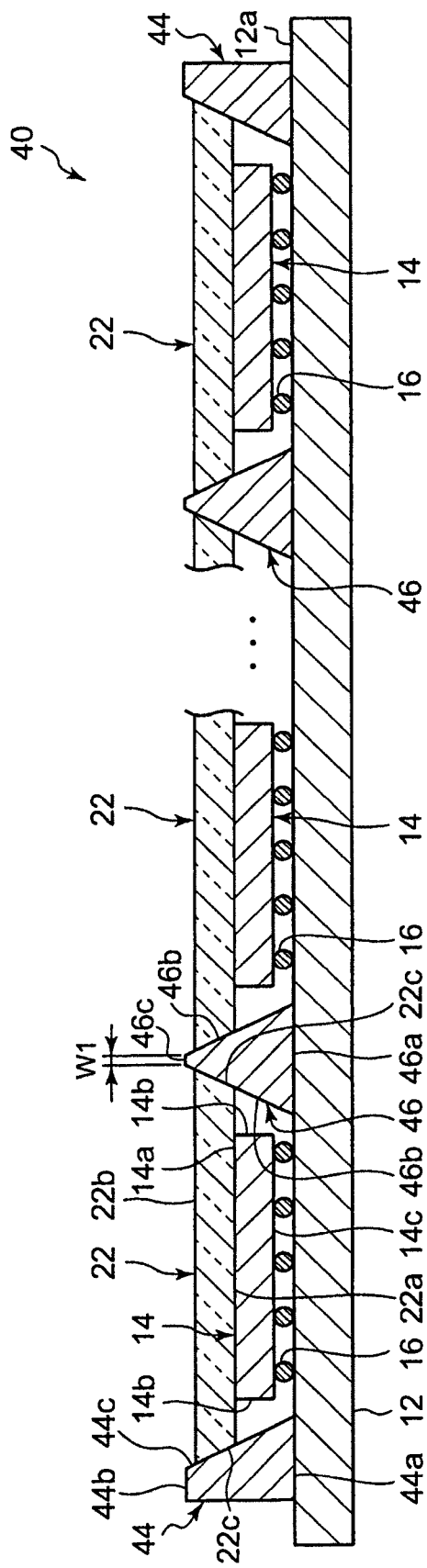
FIG. 3 is a cross-sectional view of a light emitting module according to a second embodiment of the invention.

FIG. 3 is a cross-sectional view of a light emitting module 40 according to a second embodiment. Meanwhile, FIG. 3 is a cross-sectional view taken along a plane that passes through centers of the respective semiconductor light emitting elements 14 arranged in a line like FIG. 2. A top view of the light emitting module, which is similar to the top view of the light emitting module according to the first embodiment, will be omitted herein. Hereinafter, the same components as those of the first embodiment are denoted by the same reference numerals and the description thereof will be omitted. The light emitting module 40 has the same structure as that of the light emitting module 10 according to the first embodiment except that a reflecting member 44 is provided instead of the reflecting member 18 and reflecting members 46 are provided instead of the reflecting members 20.

The reflecting member 46 is formed in the shape of a triangular prism that includes three side surfaces, that is, a lower surface 46a and a pair of reflecting surfaces 46b. The pair of reflecting surfaces 46b borders the lower surface 46a at the same angle. The inclination angle of each of the pair of reflecting surfaces 46b with respect to the lower surface 46a is the same as the inclination angle between the reflecting surface 20b and the lower surface 20a of the reflecting member 20 of the first embodiment. The lower surface 46a adheres to the mounting surface 12a, so that the reflecting member 46 is fixed to the mounting board 12. The kinds of adhesives are the same as described above. Meanwhile, the reflecting member 46 may be bonded to the mounting board 12 by solder bonding, surface activation bonding, anodic oxidation bonding, or the like.

The reflecting member 46 is disposed between each pair of semiconductor light emitting elements 14 so that the pair of semiconductor light emitting elements 14 adjacent to each other is partitioned. The lower surface 46a adheres to the mounting surface 12a, so that the reflecting member 46 is mounted on the mounting board 12. Accordingly, the reflecting member 46 extends from a gap formed between each pair of semiconductor light emitting elements 14 to a gap formed between a pair of optical wavelength conversion members 22, which faces each pair of semiconductor light emitting elements 14, of the plurality of optical wavelength conversion members 22.

The reflecting member 46 includes a pair of reflecting surfaces 46b. Even in the second embodiment, the pair of reflecting surfaces 46b faces the pair of semiconductor light emitting elements 14, which is divided by the reflecting member 46, respectively. The reflecting surface 46b is inclined to be separated from the second light emitting surface 14b of one semiconductor light emitting element 14 toward the upper side.

The reflecting member 46 is formed to protrude from the emission surfaces 22b of the pair of optical wavelength conversion members 22 that is divided by the reflecting member 46. The height of a protruding portion of the reflecting member 46 is the same as that of the reflecting member 20 of the first embodiment. Here, for the easy handling of the light emitting module 40, mechanical strength is required even at the protruding portion of the reflecting member.

For this purpose, an upper surface 46c is formed at the reflecting member 46. The apex where the pair of reflecting surface 46b crosses each other is evenly chipped off so as to be parallel to the lower surface 46a, so that the upper surface 46c is formed. The width W1 of the upper surface 46c is set in the range of about 5 to 100 μm. It may be possible to increase the mechanical strength of the reflecting member 46 by avoiding the formation of an acute-angled apex at the portion of the reflecting member 46, which protrudes from the emission surface 22b of the optical wavelength conversion member 22, as described above.

The reflecting member 44 has a lower surface 44a, an upper surface 44b, and a reflecting surface 44c. The reflecting member 44 has the same structure as that of the reflecting member 18 of the first embodiment except that the distance between the lower surface 44a and the upper surface 44b is equal to the distance between the lower surface 46a and the reflecting surface 46b of the reflecting member 46. The reflecting member 44 is placed on the mounting surface 12a of the mounting board 12 so as to surround all of the plurality of semiconductor light emitting elements 14. The lower surface 44a adheres to the mounting surface 12a, so that the reflecting member is fixed to the mounting board 12. The kinds of adhesives that may be used are the same as described above. Meanwhile, the reflecting member 44 may be bonded to the mounting board 12 by solder bonding, surface activation bonding, anodic oxidation bonding, or the like.

The reflecting surfaces 44c are the same as the reflecting surfaces 18c of the first embodiment in that the reflecting surfaces 44c face the second light emitting surfaces 14b except for the second light emitting surfaces 14b facing each other among the respective second light emitting surfaces 14b of the plurality of semiconductor light emitting elements 14 arranged in a line. Further, the reflecting surfaces 44c are also the same as the reflecting surfaces 18c of the first embodiment in that the reflecting surface 44c is inclined to be separated from the second light emitting surface 14b facing the reflecting surface 44c as approaching an upper surface 44b.

The reflecting members 44 and 46 are integrally made of silicon. When the reflecting members 44 and 46 are manufactured, first, masking is formed on portions, which correspond to the upper surface 44b of the reflecting member 44 and the upper surfaces 46c of the reflecting members 46, of a flat plate-like substrate made of single-crystalline silicon. Then, wet etching is performed from the side of the substrate on which masking has been formed, so that the reflecting surfaces 44c and 46b are formed. In this way, it may be possible to form the reflecting surfaces 44c and 46b with an accurate inclination angle of about 54.7° between the upper surface 44b and the reflecting surfaces 18c and 20b. After the reflecting surfaces 44c and 46b are formed, the masking is removed. Those skilled in the art will appreciate that the reflecting members 44 and 46 may be made of a material other than silicon.

A reflecting film having a reflectance of 85% or more is formed on the surfaces of the reflecting members 44 and 46 by depositing, for example, aluminum or silver on the surfaces of the reflecting members. In order to achieve the supply of appropriate current, the reflecting film is formed at a portion that is higher than the lower surface 44a of the reflecting member 44 by 5 μm or more and at a portion that is higher than the lower surface 46a of the reflecting member 46 by 5 μm or more.

Meanwhile, the reflecting members 44 and 46 may be made of a material other than silicon. The reflecting member 44 may be formed so that the inclination angle of the reflecting surface 44c with respect to the upper surface 44b is in a range of about 20 to 70°. The reflecting member 46 may be formed so that the inclination angle of the reflecting surface 46c with respect to the upper surface 44b is in a range of about 20 to 70°.

Third Embodiment

Figure 4A:
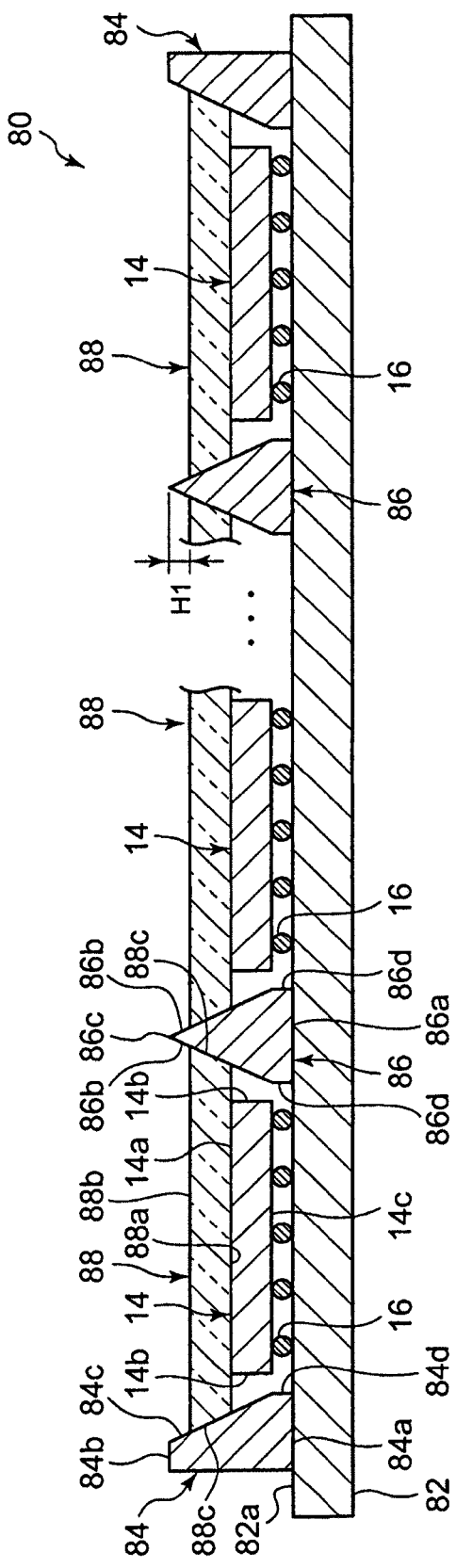
FIG. 4A is a cross-sectional view of a light emitting module according to a third embodiment of the invention.

FIG. 4A is a cross-sectional view of a light emitting module 80 according to a third embodiment of the invention. Meanwhile, FIG. 4A is a cross-sectional view taken along a plane that passes through centers of the respective semiconductor light emitting elements 14 arranged in a line like FIG. 2. A top view of the light emitting module, which is similar to the top view of the light emitting module according to the first embodiment, will be omitted herein.

The light emitting module 80 includes a mounting board 82, semiconductor light emitting elements 14, a reflecting member 84, reflecting members 86, and optical wavelength conversion members 88. The mounting board 82 is made of the same material as that of the mounting board 12 of the first embodiment in the shape of a plate. The third embodiment is the same as the first embodiment in that the plurality of semiconductor light emitting elements 14 are mounted in a line on a mounting surface 82a of the mounting board 82. However, as described below, the plurality of semiconductor light emitting elements 14 are mounted on the mounting surface 82a of the mounting board 82 with a distance, which is smaller than the distance between the semiconductor light emitting elements of the first embodiment, therebetween. For this reason, the entire length of the mounting board 82 or a distance between electrodes formed on the mounting surface 82a is smaller than that of the mounting board 12.

A plurality of optical wavelength conversion members 88 are provided so as to correspond to the plurality of semiconductor light emitting elements 14, respectively. Each of the optical wavelength conversion members 88 is formed in the shape of a plate. The optical wavelength conversion members 88 are arranged parallel to each other so that incident surfaces 88a of the optical wavelength conversion members face the first light emitting surfaces 14a of the plurality of semiconductor light emitting elements 14, respectively. The incident surface 88a adheres to the first light emitting surface 14a, so that each of the optical wavelength conversion members 88 is fixed to the semiconductor light emitting element 14. The kinds of adhesives that may be used are the same as described above. Each of the optical wavelength conversion members 88 converts the wavelength of the light emitted from the semiconductor light emitting element 14, which faces each of the optical wavelength conversion members, and emits light having the converted light.

The material of the optical wavelength conversion member 88 is the same as that of the optical wavelength conversion member 22 of the first embodiment. Accordingly, the optical wavelength conversion member 88 converts the wavelength of blue light that is mainly emitted from the semiconductor light emitting element 14, and emits yellow light. For this reason, the light emitting module 80 emits white light, that is, combined light of blue light that is transmitted through the optical wavelength conversion member 88 as it is, and yellow light that is obtained by the wavelength conversion using the optical wavelength conversion member 88.

The reflecting member 84 is formed in the shape of a rectangular frame that has a size large enough to surround all of the plurality of semiconductor light emitting elements 14, and has a quadrangular cross section. The reflecting member 84 is placed on the mounting surface 12a of the mounting board 12 so as to surround all of the plurality of the semiconductor light emitting elements 14. A lower surface 84a of the reflecting member 84 adheres to the mounting surface 12a, so that the reflecting member 84 is fixed to the mounting board 12. The kinds of adhesives that may be used are the same as described above. Meanwhile, the reflecting member 84 may be bonded to the mounting board 12 by solder bonding, surface activation bonding, anodic oxidation bonding, or the like.

The reflecting member 84 includes reflecting surfaces 84c on the inner surfaces thereof. Like the reflecting surfaces 18c of the first embodiment, the reflecting surfaces 84c face the second light emitting surfaces 14b except for the second light emitting surfaces 14b facing each other, among the respective second light emitting surfaces 14b of the plurality of semiconductor light emitting elements 14 that are arranged in a line. The reflecting surface 84c is inclined to be separated from the second light emitting surface 14b as approaching the upper surface 84b. The inclination angle of the reflecting surface 84c is the same as that of the reflecting surface 18c of the first embodiment.

The reflecting member 84 includes vertical surfaces 84d. The vertical surface borders the reflecting surface 84c, and extends perpendicular to the mounting surface 12a at a position that is more distant from the optical wavelength conversion member 88 than the reflecting surface 84c. If the vertical surface 84d is formed as described above, it may be possible for the reflecting member 84 to be close to the second light emitting surface 14b of the semiconductor light emitting element 14 and for the formation of low-luminance portions between the reflecting member 84 and the semiconductor light emitting element 14 to be suppressed.

The reflecting member 86 extends from a gap formed between each pair of semiconductor light emitting elements 14 to a gap formed between a pair of optical wavelength conversion members 88, which faces each pair of semiconductor light emitting elements 14 so that the pair of semiconductor light emitting elements 14 adjacent to each other is partitioned.

Because the plurality of semiconductor light emitting elements 14 are arranged in a line, the number of the reflecting members 86 is smaller than that of the semiconductor light emitting elements 14 by one. Meanwhile, even when the plurality of semiconductor light emitting elements 14 are arranged parallel to each other on a plane so as to form a plurality of lines, the reflecting member 86 is disposed between each pair of semiconductor light emitting elements so that the pair of semiconductor light emitting elements 14 adjacent to each other is partitioned.

In the third embodiment, the reflecting member 86 is formed in the shape of a pentagonal prism that includes a lower surface 86a, a pair of vertical surfaces 86d bordering the lower surface 86a so as to be perpendicular to the lower surface, and a pair of reflecting surfaces 86b inclined with respect to the pair of vertical surfaces 86d at the same angle, as side surfaces. The lower surface 86a adheres to the mounting surface 82a, so that the reflecting member 86 is fixed to the mounting board 82. The kinds of adhesives that may be used are the same as described above. Meanwhile, the reflecting member 86 may be bonded to the mounting board 82 by solder bonding, surface activation bonding, anodic oxidation bonding, or the like.

In this case, the pair of reflecting surfaces 86b faces the second light emitting surfaces 14b of the pair of semiconductor light emitting elements 14 adjacent to each other, respectively. Meanwhile, the reflecting surfaces 86b may be formed to face the second light emitting surface 14b of at least one of the pair of semiconductor light emitting elements 14.

Each of the pair of reflecting surfaces 86b is inclined to be separated from the second light emitting surface 14b facing the reflecting surface as approaching an apex 86c where the pair of reflecting surfaces cross each other. If the reflecting members 86 are formed as described above, it may be possible to suppress the formation of low-luminance portions between the semiconductor light emitting elements 14 even when the plurality of semiconductor light emitting elements 14 are arranged parallel to each other, and to efficiently utilize the light that is emitted from each of the semiconductor light emitting elements 14. Meanwhile, the reflecting surfaces 86b may be formed to face the second light emitting surface 14b of at least one of the pair of semiconductor light emitting elements 14.

Each of the pair of vertical surfaces 86d borders the lower end of each of the pair of reflecting surfaces 86b, and extends perpendicular to the first light emitting surface 14a and the mounting surface 82a at a position that is more distant from the optical wavelength conversion member 88 than the reflecting surface 86b. If the vertical surface 86d is formed as described above, it may be possible for the reflecting member 86 to be close to the second light emitting surface 14b of the semiconductor light emitting element 14 even between the pair of semiconductor light emitting elements 14 adjacent to each other, and for the formation of low-luminance portions between the reflecting member 86 and the semiconductor light emitting element 14 to be suppressed.

The reflecting member 86 is formed to protrude from the pair of optical wavelength conversion members 88 that is divided by the reflecting member 86. The protrusion height of the reflecting member 86 is the same as that of the reflecting member 20 of the first embodiment. Meanwhile, the reflecting member 86 may be formed to protrude from one of the pair of optical wavelength conversion members 88 that is divided by the reflecting member 86.

Further, the pair of optical wavelength conversion members 88, which is divided by the reflecting member 86, is placed on the pair of reflecting surfaces 86b of the reflecting member 86, respectively. Furthermore, the optical wavelength conversion members 88 are also placed on the reflecting surfaces 84c of the reflecting member 84, respectively.

The side surfaces 88c of the optical wavelength conversion member 88 are inclined to increase the distances between the side surfaces 88c and the middle of the optical wavelength conversion member 88 as approaching the emission surface 88b, so that the optical wavelength conversion member 88 is placed on the reflecting surface 86b. The optical wavelength conversion member 88 is formed so that the inclination angle of each of four side surfaces 88c with respect to the incident surface 88a is equal to the inclination angle of the reflecting surface 84c with respect to the first light emitting surface 14a and the inclination angle of the reflecting surface 86b with respect to the first light emitting surface 14a.

The reflecting members 84 and 86 are integrally made of silicon. Accordingly, when the reflecting members 84 and 86 are manufactured, first, masking is formed on portions, which correspond to the upper surface 84b of the reflecting member 84 and the apexes 86c of the reflecting members 86, of a flat plate-like substrate made of single-crystalline silicon. Then, wet etching is performed from the side of the substrate on which masking has been formed, so that the reflecting surfaces 84c and 86b are formed. For this reason, the reflecting surfaces 84c and 86b are inclined with respect to the upper surface 84b by an angle of about 54.7°. After the reflecting surfaces 84c and 86b are formed, the masking is removed.

After the reflecting surfaces 84c and 86b are formed, masking is formed on portions of the substrate that correspond to the lower surface 84a of the reflecting member 84 and the lower surfaces 86a of the reflecting members 86. Then, dry etching is performed at this time from the side of the substrate on which masking has been formed, so that the vertical surfaces 86d of the reflecting member 84 and the vertical surfaces 86d of the reflecting members 86 are formed. After the vertical surfaces 86d and 86d are formed, the masking is removed again.

A reflecting film having a reflectance of 85% or more is formed on the surfaces of the reflecting members 84 and 86 by depositing, for example, aluminum or silver on the surfaces of the reflecting members. In order to achieve the supply of appropriate current, the reflecting film is formed at a portion that is higher than the lower surface 84a of the reflecting member 84 by 5 μm or more and at a portion that is higher than the lower surface 86a of the reflecting member 86 by 5 μm or more.

Meanwhile, the reflecting members 84 and 86 may be made of a material other than silicon. The reflecting member 84 may be formed so that the inclination angle of the reflecting surface 84c with respect to the upper surface 84b is in a range of about 20 to 70°. The reflecting member 86 may be formed so that the inclination angle of the reflecting surface 86b with respect to the upper surface 84b is in a range of about 20 to 70°.

Figure 4B:
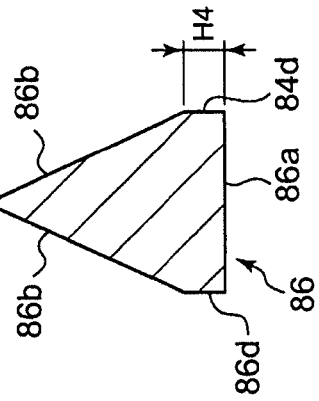
FIG. 4B is an enlarged view of a semiconductor light emitting element that is mounted on a mounting board.
Figure 4C:
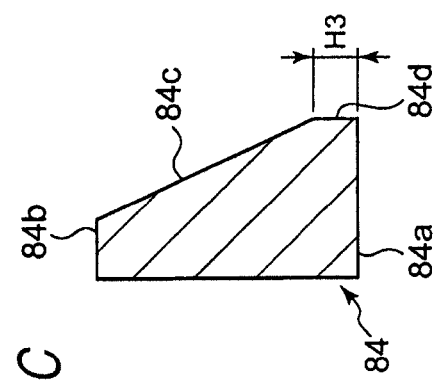
FIG. 4C is an enlarged view of a reflecting member.
Figure 4D:
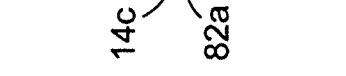
FIG. 4D is an enlarged view of the other reflecting member.

FIG. 4B is an enlarged view of the semiconductor light emitting element 14 that is mounted on the mounting board mounting board 82. FIG. 4C is an enlarged view of the reflecting member 84. FIG. 4D is an enlarged view of one reflecting member 86. As shown in FIG. 4B, the height of a gap between the mounting surface 82a of the mounting board 82 and the back surface 14c of the semiconductor light emitting element 14 is referred to as a non-light emitting region height H2. The non-light emitting region height H2 is set in a range of about 5 to 100 μm. Further, as shown in FIG. 4C, the height of the vertical surface 84d is referred to as a vertical surface height H3. Furthermore, as shown in FIG. 4D, the height of the vertical surface 86d is referred to as a vertical surface height H4.

In the third embodiment, the reflecting member 84 is formed so that the vertical surface height H3 is equal to the non-light emitting region height H2. Meanwhile, it has been confirmed that it might be possible to efficiently utilize the light emitted from the semiconductor light emitting element 14 while suppressing the formation of low-luminance portions between the reflecting member 84 and the semiconductor light emitting element 14 if a value, which is obtained by subtracting the vertical surface height H3 from the non-light emitting region height H2, is in a range of 0 to about 30 μm. Accordingly, the vertical surface 84d may be formed so that a value, which is obtained by subtracting the vertical surface height H3 from the non-light emitting region height H2, is in this range.

Further, the reflecting member 86 is formed so that the vertical surface height H4 is equal to the non-light emitting region height H2. Meanwhile, it has been confirmed that it might be possible to efficiently utilize the light emitted from the semiconductor light emitting element 14 while suppressing the formation of low-luminance portions between the reflecting member 86 and the semiconductor light emitting element 14 if a value, which is obtained by subtracting the vertical surface height H4 from the non-light emitting region height H2, is in a range of 0 to about 30 μm. Accordingly, the vertical surface 86d may be formed so that a value, which is obtained by subtracting the vertical surface height H4 from the non-light emitting region height H2, is in this range.

Meanwhile, the apex 86c of the reflecting member 86 may also be evenly chipped off like the reflecting member 20 of the second embodiment. The width of the upper surface of the reflecting member, which is formed as described above, may be in a range of about 5 to 100 μm.

Fourth Embodiment

FIG. 5A is a cross-sectional view of a light emitting module 100 according to a fourth embodiment of the invention. Meanwhile, FIG. 5A is a cross-sectional view taken along a plane that passes through centers of the respective semiconductor light emitting elements 104 arranged in a line like FIG. 2. A top view of the light emitting module, which is similar to the top view of the light emitting module according to the first embodiment, will be omitted herein.

The light emitting module 100 includes a mounting board 102, semiconductor light emitting elements 104, a reflecting member 110, reflecting members 112, and optical wavelength conversion members 114. The mounting board 102 is made of the same material as that of the mounting board 102 of the first embodiment in the shape of a plate. The fourth embodiment is the same as the first embodiment in that the plurality of semiconductor light emitting elements 104 are mounted in a line on a mounting surface 102a of the mounting board 102. The plurality of semiconductor light emitting elements 104 are mounted so that a main light emitting surface of each of the semiconductor light emitting elements 104 is parallel to the mounting surface 102a.

The mounting board 102 has an area large enough for the plurality of semiconductor light emitting elements 104 to be mounted. Even in the fourth embodiment, the plurality of semiconductor light emitting elements 104 are arranged parallel to each other with a distance therebetween. However, a plurality of mounting boards 102 may be arranged parallel to each other so as to form a plurality of lines, that is, the plurality of mounting boards 102 may be arranged parallel to each other on a plane.

A so-called vertical chip type semiconductor light emitting element is employed as the semiconductor light emitting element 104. Electrodes (not shown) are provided on both surfaces of the semiconductor light emitting element 104. Electrodes are provided on the mounting surface 102a of the mounting board 102. Accordingly, when the plurality of semiconductor light emitting elements 104 are mounted on the mounting surface 102a of the mounting board 102, the electrodes provided on the upper surfaces of the semiconductor light emitting elements 104 are directly connected to the electrodes provided on the mounting surface 102a and the electrodes provided on the lower surfaces of the semiconductor light emitting elements 104 are connected to other electrodes provided on the mounting surface 102a through conductive wires (not shown).

The electrodes provided on the mounting surface 102a connect the plurality of semiconductor light emitting elements 104 with an electric power source through a switching circuit so as to independently supply current to each of the plurality of semiconductor light emitting elements 104. Accordingly, it may be possible to independently control the turning-on of each of the plurality of semiconductor light emitting elements 104. Meanwhile, the plurality of semiconductor light emitting elements 104 may be electrically connected to each other in parallel and series by the electrodes provided on the mounting surface 102a so that electric power can be supplied to the plurality of semiconductor light emitting elements 104 at the same time.

The semiconductor light emitting element 104 is formed of an LED element. A blue LED, which mainly emits blue-wavelength light, is employed as the semiconductor light emitting element 104 in the fourth embodiment, and is formed so that the center wavelength of emitted blue light is about 470 nm. Those skilled in the art will appreciate that the wavelength of light emitted from the semiconductor light emitting element 104 is not limited to the above-mentioned wavelength, and a semiconductor light emitting element, which mainly emits light other than blue-wavelength light, may be employed as the semiconductor light emitting element 104. The material of the semiconductor layer of the semiconductor light emitting element 104 and the size and shape of the semiconductor light emitting element 104 are the same as those of the semiconductor light emitting element 104 of the first embodiment.

The semiconductor light emitting element 104 includes a light emitting part 106 and a substrate 108. The light emitting part 106 is a semiconductor layer, and the substrate 108 is a crystal growth substrate of the light emitting part 106. Because the material and the like of the substrate 108 are well known, the description thereof will be omitted herein. For this reason, the substrate 108 does not emit light, and light is emitted from the only light emitting part 106.

The light emitting portion 106 is formed in the shape of a plate having a first light emitting surface 106a that is a main light emitting surface having a square shape, and four second light emitting surfaces 106b each of which borders the first light emitting surface 106a. The substrate 108 is formed in the same shape as that of the light emitting part 106, that is, in the shape of a plate having a square shape. A lower surface 108a of the substrate is mounted on the mounting surface 102a of the mounting board 102, so that the substrate 108 is fixed to the mounting board 102.

A plurality of optical wavelength conversion members 114 are provided so as to correspond to the plurality of semiconductor light emitting elements 104, respectively. Each of the optical wavelength conversion members 114 is formed in the shape of a plate. The optical wavelength conversion members 114 are arranged parallel to each other so that incident surfaces 114a of the optical wavelength conversion members 114 face the first light emitting surfaces 104a of the plurality of semiconductor light emitting elements 104, respectively. The optical wavelength conversion members 114 convert the wavelengths of light emitted from the light emitting elements 104 that face the optical wavelength conversion members 114, respectively, and emit light having the converted light. The material or thickness of the optical wavelength conversion member 114 is the same as that of the optical wavelength conversion member 22 of the first embodiment except for the size defined by side surfaces 114c of the optical wavelength conversion member 114.

The reflecting member 110 is formed in the shape of a rectangular frame that has a size large enough to surround the plurality of semiconductor light emitting elements 104. The reflecting member 110 is placed on the mounting surface 102a of the mounting board 102 so as to surround the plurality of the semiconductor light emitting elements 104. A lower surface 110a of the reflecting member adheres to the mounting surface 102a, so that the reflecting member 110 is fixed to the mounting board 102. The kinds of adhesives are the same as described above. Meanwhile, the reflecting member 110 may be bonded to the mounting board 102 by solder bonding, surface activation bonding, anodic oxidation bonding, or the like.

Further, the reflecting member 110 also includes reflecting surfaces 110c on the inner surfaces thereof. Like the reflecting surfaces 18c of the first embodiment, the reflecting surfaces 110c face the second light emitting surfaces 106b parallel to the arrangement direction of the semiconductor light emitting elements 104, among the respective second light emitting surfaces 106b of the plurality of semiconductor light emitting elements 104. Furthermore, the reflecting surfaces 110c also face the outer second light emitting surfaces 106b of the semiconductor light emitting elements 104 that are positioned on both ends. The reflecting surface 110c is inclined to be separated from the second light emitting surface 106b as approaching an upper surface 110b of the reflecting member. A method of forming the reflecting surface 110c or the inclination angle of the reflecting surface 110c is the same as the method of forming the reflecting surface 18c of the first embodiment or the inclination angle of the reflecting surface 18c. Moreover, the reflecting member 110 includes vertical surfaces 110d that border the lower ends of the reflecting surfaces 110c and extend perpendicular to the first light emitting surface 104a and the mounting surface 102a at positions more distant from the optical wavelength conversion member 114 than the reflecting surfaces 110c.

The reflecting member 112 extends from a gap formed between each pair of semiconductor light emitting elements 104 to a gap formed between a pair of optical wavelength conversion members 114, which faces each pair of semiconductor light emitting elements 104, of the plurality of optical wavelength conversion members 114 so that the pair of semiconductor light emitting elements 104 adjacent to each other is partitioned.

The reflecting member 112 includes a pair of reflecting surfaces 112b. The pair of reflecting surfaces 112b faces the second light emitting surfaces 106b of the pair of semiconductor light emitting elements 104, which is divided by the reflecting member 112, respectively. Each of the pair of reflecting surfaces 112b is inclined to be separated from the second light emitting surface 106b facing the reflecting surface as approaching an apex 112c where the pair of reflecting surfaces cross each other. Accordingly, even when the plurality of semiconductor light emitting elements 104 are mounted as described above, it may be possible to suppress the formation of low-luminance portions between a pair of optical wavelength conversion members 114 adjacent to each other.

Because the plurality of semiconductor light emitting elements 104 are arranged in a line, the number of the reflecting members 112 is smaller than that of the semiconductor light emitting elements 104 by one. Meanwhile, even when the plurality of semiconductor light emitting elements 104 are arranged parallel to each other on a plane so as to form a plurality of lines, the reflecting member 112 is disposed between each pair of semiconductor light emitting elements so that the pair of semiconductor light emitting elements 104 adjacent to each other is partitioned.

In the fourth embodiment, the reflecting member 112 is formed in the shape of a pentagonal prism that includes a lower surface 112a, a pair of vertical surfaces 112d bordering the lower surface 112a so as to be perpendicular to the lower surface, and a pair of reflecting surfaces 112b inclined with respect to the pair of vertical surfaces 112d at the same angle, as side surfaces. The lower surface 112a adheres to the mounting surface 102a, so that the reflecting member 112 is fixed to the mounting board 102. The kinds of adhesives that may be used are the same as described above. Meanwhile, the reflecting member 112 may be bonded to the mounting board 102 by solder bonding, surface activation bonding, anodic oxidation bonding, or the like.

In this case, the pair of reflecting surfaces 112b faces the second light emitting surfaces 106b of the pair of semiconductor light emitting elements 104 adjacent to each other, respectively. The reflecting member 112 is formed so that an apex of the reflecting member between the pair of reflecting surfaces 112b comes into contact with the incident surface 114a of the optical wavelength conversion member 114. Meanwhile, the reflecting surfaces 112b may be formed to face the second light emitting surface 106b of at least one of the pair of semiconductor light emitting elements 104.

Each of the pair of reflecting surfaces 112b is inclined to be separated from the second light emitting surface 106b facing the reflecting surface as approaching the incident surface 114a of the optical wavelength conversion member 114. If the reflecting members 112 are formed as described above, it may be possible to suppress the formation of low-luminance portions between the semiconductor light emitting elements 104 even when the plurality of semiconductor light emitting elements 104 are arranged parallel to each other. Further, it may be possible to efficiently utilize the light that is emitted from each of the semiconductor light emitting elements 104. Meanwhile, the reflecting surfaces 112b may be formed to face the second light emitting surface 106b of at least one of the pair of semiconductor light emitting elements 104.

Each of the pair of vertical surfaces 112d borders the adjacent reflecting surface 112b, and extends perpendicular to the first light emitting surface 104a and the mounting surface 102a at a position that is more distant from the optical wavelength conversion member 114 than the reflecting surface 112b. If the vertical surface 112d is formed as described above, it may be possible to make the reflecting member 112 be close to the second light emitting surface 106b of the semiconductor light emitting element 104 even between the pair of semiconductor light emitting elements 104 adjacent to each other and to suppress the formation of low-luminance portions between the reflecting member and the semiconductor light emitting element.

The reflecting member 112 is formed to protrude from the pair of optical wavelength conversion members 114 that is divided by the reflecting member 112. The protrusion height of the reflecting member 112 is the same as that of the reflecting member 20 of the first embodiment. Meanwhile, the reflecting member 112 may be formed to protrude from one of the pair of optical wavelength conversion members 114 that is divided by the reflecting member 112.

Further, the pair of optical wavelength conversion members 114, which is divided by the reflecting member 112, is placed on the pair of reflecting surfaces 112b of the reflecting member 112, respectively. Furthermore, the optical wavelength conversion members 114 are also placed on the reflecting surfaces 110c of the reflecting member 110, respectively.

As approaching an emission surface 114b, the side surfaces 114c of the optical wavelength conversion member 114 are inclined to increase the distances between the side surfaces 114c and the middle of the optical wavelength conversion member 114 so that the optical wavelength conversion member is placed on the reflecting surface 112b. The optical wavelength conversion member 144 is formed so that the inclination angle of each of four side surfaces 114c with respect to the incident surface 114a is equal to the inclination angle of the reflecting surface 110c with respect to the first light emitting surface 104a and the inclination angle of the reflecting surface 112b with respect to the first light emitting surface 104a.

The reflecting members 110 and 112 are made of silicon, and are formed integrally with each other. Accordingly, when the reflecting member 110 and the reflecting members 112 are manufactured, first, masking is formed on portions, which correspond to the upper surface 110b of the reflecting member 110 and the apexes 112c of the reflecting members 112, of a flat plate-like substrate made of single-crystalline silicon. Then, wet etching is performed from the side of the substrate on which masking has been formed, so that the reflecting surfaces 110c and the reflecting surfaces 112b are formed. For this reason, the reflecting surface 110c and the reflecting surfaces 112b are inclined with respect to the upper surface 110b by an angle of about 54.7°. After the reflecting surfaces 110c and the reflecting surfaces 112b are formed, the masking is removed.

After the reflecting surfaces 110c and the reflecting surfaces 112b are formed, masking is formed on portions of the substrate that correspond to the lower surface 110a of the reflecting member 110 and the lower surfaces 112a of the reflecting members 112. Then, dry etching is performed at this time from the side of the substrate on which masking has been formed, so that the vertical surfaces 110d of the reflecting member 110 and the vertical surfaces 112d of the reflecting members 112 are formed. After the vertical surfaces 110d and 112d are formed, the masking is removed again.

A reflecting film having a reflectance of 85% or more is formed on the surfaces of the reflecting members 110 and 112 by depositing, for example, aluminum or silver on the surfaces of the reflecting members. In order to achieve the supply of appropriate current, the reflecting film is formed at a portion that is higher than the lower surface 110a of the reflecting member 110 by 5 μm or more and at a portion that is higher than the lower surface 112a of the reflecting member 112 by 5 μm or more.

Meanwhile, the reflecting members 110 and 112 may be made of a material other than silicon. The reflecting member 110 may be formed so that the inclination angle of the reflecting surface 110c with respect to the upper surface 110b is in a range of about 20 to 70°. The reflecting member 112 may be formed so that the inclination angle of the reflecting surface 112b with respect to the upper surface 110b is in a range of about 20 to 70°.

FIG. 5B is an enlarged view of the semiconductor light emitting element 104 that is mounted on the mounting board 102. FIG. 5C is an enlarged view of the reflecting member 110. FIG. 5D is an enlarged view of one reflecting member 112. As shown in FIG. 5B, the height of a side surface 108b of the substrate 108 is referred to as a substrate-side surface height H5. The substrate-side surface height H5 is set in a range of 0 to about 300 μm. Further, as shown in FIG. 5C, the height of the vertical surface 110d is referred to as a vertical surface height H6. Furthermore, as shown in FIG. 5D, the height of the vertical surface 112d is referred to as a vertical surface height H7.

In the fourth embodiment, the reflecting member 110 is formed so that the vertical surface height H6 is equal to the substrate-side surface height H5. If a portion of the reflecting member 110 facing the side surface 108b is formed as the vertical surface 110d and a portion of the reflecting member 110 facing the second light emitting surface 106b is formed as the reflecting surface 110c as described above, it may be possible to suppress the formation of low-luminance regions between the semiconductor light emitting element 104 and the reflecting member by making the reflecting member 110 be close to the semiconductor light emitting element 104, while efficiently utilizing the light emitted from the second light emitting surface 106b.

Meanwhile, it has been confirmed that it might be possible to efficiently utilize the light emitted from the semiconductor light emitting element 104 while suppressing the formation of low-luminance portions between the reflecting member 110 and the semiconductor light emitting element 104 if a value, which is obtained by subtracting the vertical surface height H6 from the substrate-side surface height H5, is in a range of 0 to about 30 μm. Accordingly, the vertical surface 110d may be formed so that a value, which is obtained by subtracting the vertical surface height H6 from the substrate-side surface height H5, is in this range.

Further, the reflecting member 112 is formed so that the vertical surface height H7 is equal to the substrate-side surface height H5. If a portion of the reflecting member 112 facing the side surface 108b is formed as the vertical surface 112d and a portion of the reflecting member 112 facing the second light emitting surface 106b is formed as the reflecting surface 112b as described above, it may be possible to suppress the formation of low-luminance regions between the semiconductor light emitting element 104 and the reflecting member 112 by the reflecting member 112 being made close to the semiconductor light emitting element 104, while efficiently utilizing the light emitted from the second light emitting surface 106b.

Meanwhile, it has been confirmed that it might be possible to efficiently utilize the light emitted from the semiconductor light emitting element 104 while suppressing the formation of low-luminance portions between the reflecting member 112 and the semiconductor light emitting element 104 if a value, which is obtained by subtracting the vertical surface height H7 from the substrate-side surface height H5, is in a range of 0 to about 30 μm. Accordingly, the vertical surface 112d may be formed so that a value, which is obtained by subtracting the vertical surface height H7 from the substrate-side surface height H5, is in this range.

Meanwhile, the apex 112c of the reflecting member 112 may also be evenly chipped off like the reflecting member 20 of the second embodiment. The width of the upper surface of the reflecting member 112, which is formed as described above, may be in the range of about 5 to 100 μm.

Fifth Embodiment

Figure 6:
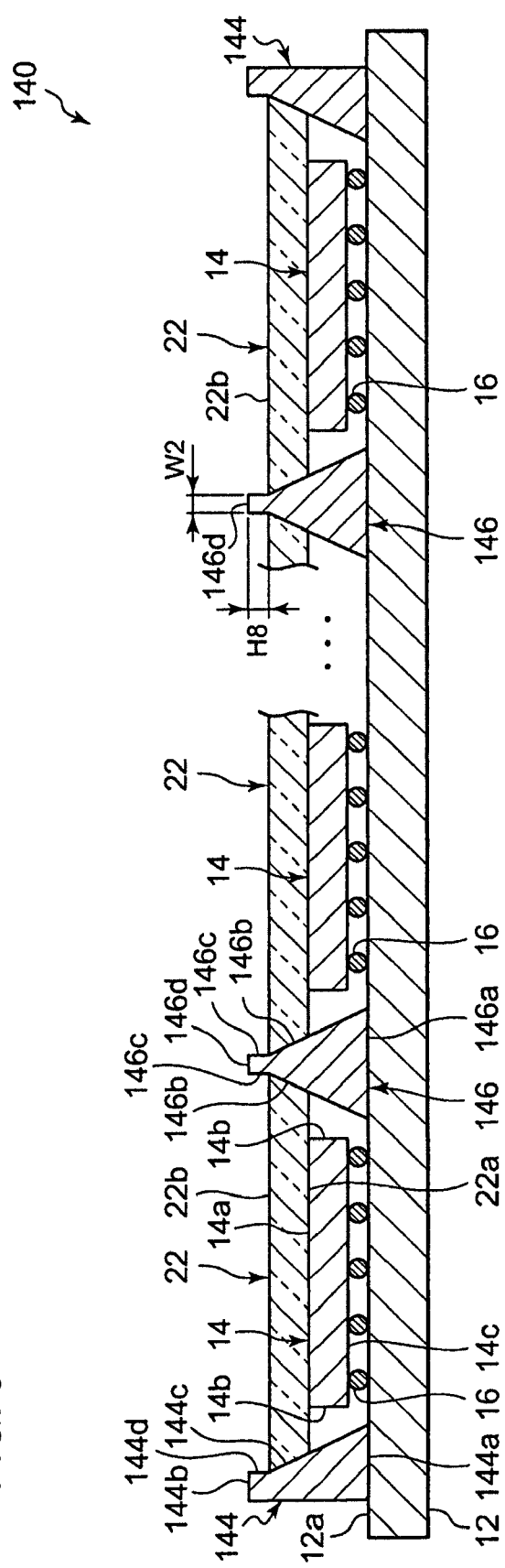
FIG. 6 is a cross-sectional view of a light emitting module according to a fifth embodiment of the invention.

FIG. 6 is a cross-sectional view of a light emitting module 140 according to a fifth embodiment of the invention. Meanwhile, FIG. 6 is a cross-sectional view taken along a plane that passes through centers of the respective semiconductor light emitting elements 14 arranged in a line shown in FIG. 2. A top view of the light emitting module, which is similar to the top view of the light emitting module according to the first embodiment, will be omitted herein. Hereinafter, the same components as those of the above-mentioned embodiment are denoted by the same reference numerals and the description thereof will be omitted herein. The light emitting module 140 has the same structure as that of the light emitting module 10 according to the first embodiment except that a reflecting member 144 is provided instead of the reflecting member 18 and reflecting members 146 are provided instead of the reflecting members 20.

The reflecting member 146 is formed in the shape of a triangular prism that includes three side surfaces, that is, a lower surface 146a and a pair of reflecting surfaces 146b. The pair of reflecting surfaces 146b borders the lower surface 146a at the same angle. The inclination angle of each of the pair of reflecting surfaces 146b with respect to the lower surface 146a is the same as the inclination angle between the reflecting surface 20b and the lower surface 20a of the reflecting member 20 of the first embodiment.

The reflecting member 146 is disposed between each pair of semiconductor light emitting elements 14 so that the pair of semiconductor light emitting elements 14 adjacent to each other is partitioned. A lower surface 146a adheres to a mounting surface 12a, so that the reflecting member 146 is mounted on a mounting board 12. The kinds of adhesives that may be used are the same as described above. Meanwhile, the reflecting member 146 may be bonded to the mounting board 12 by solder bonding, surface activation bonding, anodic oxidation bonding, or the like. Accordingly, the reflecting member 146 extends from a gap formed between each pair of semiconductor light emitting elements 14 to a gap formed between a pair of optical wavelength conversion members 22, which faces each pair of semiconductor light emitting elements 14, of a plurality of optical wavelength conversion members 22.

In this case, the pair of reflecting surfaces 146b faces the pair of semiconductor light emitting elements 14, which is divided by the reflecting member 146, respectively. The reflecting surface 146b is inclined to be separated from a second light emitting surface 14b of one semiconductor light emitting element 14 as approaching an emission surface 22b of the optical wavelength conversion member 22.

The reflecting member 146 is formed to protrude from the emission surfaces 22b of the pair of optical wavelength conversion members 22 that is divided by the reflecting member 20. The height of a protruding portion of the reflecting member 146, that is, a protrusion height H8 between the emission surface 22b of the optical wavelength conversion member 22 and the upper surface 146d of the reflecting member 146 is in a range of about 5 to 200 μm. Here, for the easy handling of the light emitting module 140, mechanical strength is required even at the protruding portion of the reflecting member.

For this purpose, the reflecting member 146 includes a pair of vertical surfaces 146c at the portion thereof that protrudes upward from the emission surface 22b of the optical wavelength conversion member 22. The pair of vertical surfaces 146c borders the upper ends of the pair of reflecting surfaces 146b, respectively, and extends perpendicular to the mounting surface 12a at a position above the emission surface 22b of the optical wavelength conversion member 22. Each of the pair of vertical surfaces 146c extends up to the upper surface 146d of the reflecting member 146. The upper surface 146d is formed in the shape of a plane parallel to the lower surface 146a. The width W2 of the upper surface 146d is set in a range of about 5 to 100 µm. It may be possible to increase the mechanical strength of the reflecting member 146 by avoiding the formation of an acute-angled apex at the portion of the reflecting member 146, which protrudes from the emission surface 22b of the optical wavelength conversion member 22, as described above.

Further, the reflecting member 144 also includes vertical surfaces 144d at the portions thereof that protrude upward from the emission surface 22b of the optical wavelength conversion member 22. The reflecting member 144 is formed to have the same shape as that of the reflecting member 18 of the first embodiment except for the vertical surfaces. The reflecting member 144 is placed on the mounting surface 12a of the mounting board 12 so as to surround all of the plurality of the semiconductor light emitting elements 14. A lower surface 144a of the reflecting member 144 adheres to the mounting surface 12a, so that the reflecting member 144 is fixed to the mounting board 12. The kinds of adhesives that may be used are the same as described above. Meanwhile, the reflecting member 144 may be bonded to the mounting board 12 by solder bonding, surface activation bonding, anodic oxidation bonding, or the like.

The reflecting surface 144c is the same as the reflecting surface 18c of the first embodiment in that the reflecting surfaces 144c face the second light emitting surfaces 14b except for the second light emitting surfaces 14b facing each other. Moreover, the reflecting surface 144c is also the same as the reflecting surface 18c of the first embodiment in that the reflecting surface 144c is inclined to be separated from the second light emitting surface 14b facing the reflecting surface as approaching the emission surface 22b of the optical wavelength conversion member 22.

The vertical surface 144d borders an upper end of the reflecting surface 144c, and extends perpendicular to the mounting surface 12a at a position above the emission surface 22b of the optical wavelength conversion member 22. Accordingly, it may be possible to suppress the decrease of the width of the upper portion of the reflecting member 144 and to increase the mechanical strength of the reflecting member 144.

The reflecting members 144 and 146 are integrally made of silicon. When the reflecting members 144 and 146 are manufactured, first, masking is formed on portions, which correspond to the upper surface 144b of the reflecting member 144 and the upper surfaces 146d of the reflecting members 146, of a flat plate-like substrate made of single-crystalline silicon. Then, dry etching is performed up to a predetermined depth from the side of the substrate on which masking has been formed, so that the vertical surfaces 144d and 146c are formed.

After that, wet etching is performed from the same side of the substrate as described above, so that the reflecting surfaces 144c and 146b are formed. In this way, it may be possible to form the reflecting surfaces 144c and 146b with an inclination angle of about 54.7° between the reflecting surfaces and the upper surface 144b. After the reflecting surfaces 144c and 146b are formed, the masking is removed. Those skilled in the art will appreciate that the reflecting members 144 and 146 may be made of a material other than silicon.

A reflecting film having a reflectance of 85% or more is formed on the surfaces of the reflecting members 144 and 146 by depositing, for example, aluminum or silver on the surfaces of the reflecting members 144. In order to achieve the supply of appropriate current, the reflecting film is formed at a portion that is higher than the lower surface 144a of the reflecting member 144 by 5 µm or more and at a portion higher that is than the lower surface 146a of the reflecting member 146 by 5 µm or more.

Meanwhile, the reflecting members 144 and 146 may be made of a material other than silicon. The reflecting member 144 may be formed so that the inclination angle of the reflecting surface 144c with respect to the upper surface 144b is in the range of about 20 to 70°. The reflecting member 146 may be formed so that the inclination angle of the reflecting surface 146b with respect to the upper surface 144b is in the range of about 20 to 70°.

Meanwhile, the reflecting member 144 may include vertical surfaces that border the lower ends of the reflecting surfaces 144c and extend perpendicular to the mounting surface 12a at positions more distant from the optical wavelength conversion member 22 than the reflecting surfaces 144c. Further, the reflecting member 146 may include vertical surfaces that border the lower ends of the reflecting surfaces 146b and extend perpendicular to the mounting surface 12a at positions more distant from the optical wavelength conversion member 22 than the reflecting surfaces 146b. In this case, the vertical surface may be formed so that a value, which is obtained by subtracting the height of the vertical surface from the non-light emitting region height H2, is in the range of 0 to about 30 µm. Accordingly, it may be possible to suppress the formation of low-luminance portions between the reflecting member 144 and the semiconductor light emitting element 14 or between the reflecting member 144 and the semiconductor light emitting element 14.

Sixth Embodiment

Figure 7:
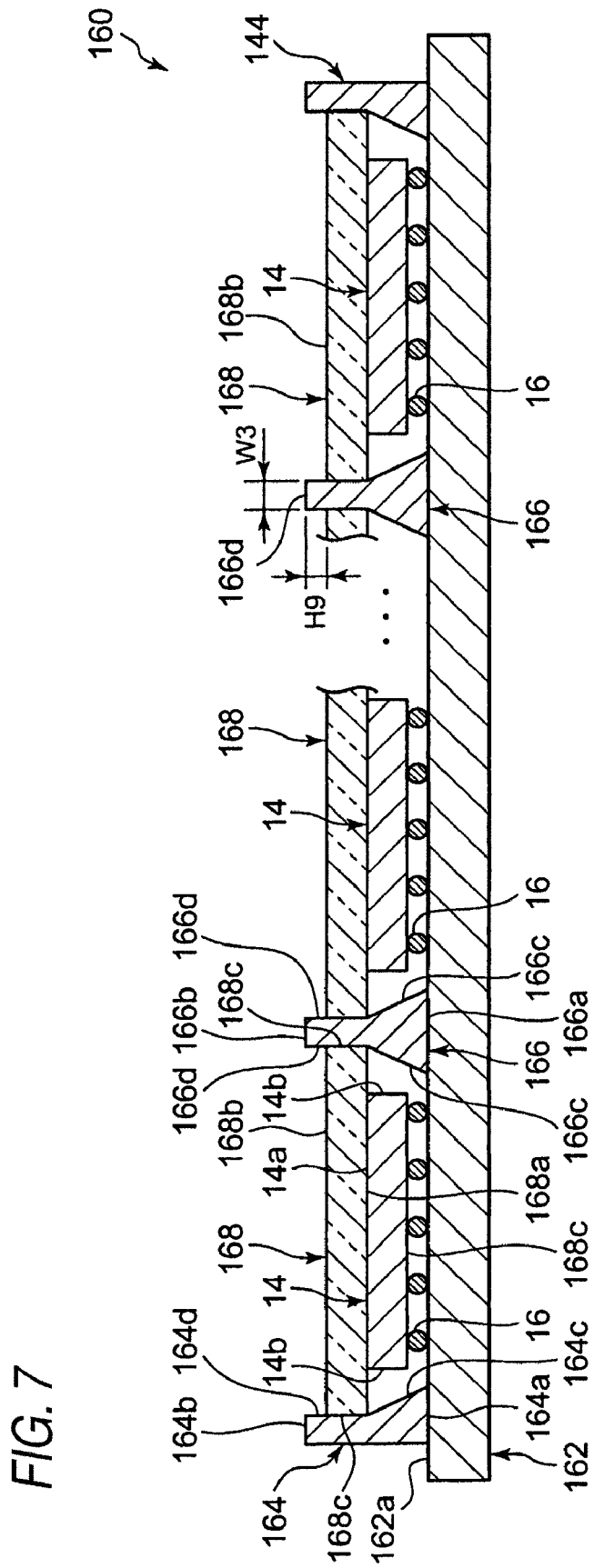
FIG. 7 is a cross-sectional view of a light emitting module according to a sixth embodiment of the invention.

FIG. 7 is a cross-sectional view of a light emitting module 160 according to a sixth embodiment of the invention. Meanwhile, FIG. 7 is a cross-sectional view taken along a plane that passes through centers of respective semiconductor light emitting elements 14 arranged in a line shown in FIG. 2. A top view of the light emitting module, which is similar to the top view of the light emitting module according to the first embodiment, will be omitted herein. Hereinafter, the same components as those of the above-mentioned embodiment are denoted by the same reference numerals and the description thereof will be omitted herein. The light emitting module 160 has the same structure as that of the light emitting module 10 according to the first embodiment except that a mounting board 162, optical wavelength conversion members 168, a reflecting member 164, and reflecting members 166 are provided instead of the mounting board 12, the optical wavelength conversion members 22, the reflecting member 18, and the reflecting members 20, respectively.

The mounting board 162 is made of the same material as that of the mounting board 12 of the first embodiment in the shape of a plate. The sixth embodiment is the same as the first embodiment in that the plurality of semiconductor light emitting elements 14 are mounted in a line on a mounting surface 162a of the mounting board 162. However, as described below, the plurality of semiconductor light emitting elements 14 are mounted on the mounting surface 162a of the mounting board 162 with a distance, which is smaller than the distance between the semiconductor light emitting elements of the first embodiment, therebetween. For this reason, the entire length of the mounting board 162 or a distance between electrodes formed on the mounting surface 162a is smaller than that of the mounting board 12.

A plurality of optical wavelength conversion members 168 are provided so as to correspond to the plurality of semiconductor light emitting elements 14, respectively. Each of the optical wavelength conversion members 168 is formed in the shape of a plate. The optical wavelength conversion members 168 are arranged parallel to each other so that incident surfaces 168a of the optical wavelength conversion members 168 face the first light emitting surfaces 14a of the plurality of semiconductor light emitting elements 14, respectively. The incident surface 168a adheres to the first light emitting surface 14a, so that each of the optical wavelength conversion members 168 is fixed to the semiconductor light emitting element 14. The kinds of adhesives that may be used are the same as described above. Each of the optical wavelength conversion members 168 converts the wavelength of the light emitted from the semiconductor light emitting element 14, which faces each of the optical wavelength conversion members 168, and emits light having the converted wavelength. The optical wavelength conversion member 168 has the same structure as that of the optical wavelength conversion member 22 of the first embodiment in terms of a material and the like except that side surfaces 168c are formed perpendicular to the incident surface 168a and an emission surface 168b.

The reflecting member 166 is formed in the shape of a triangular prism that includes three side surfaces, that is, a lower surface 166a and a pair of reflecting surfaces 166b. The pair of reflecting surfaces 166c borders the lower surface 166a at the same angle. The inclination angle of each of the pair of reflecting surfaces 166c with respect to the lower surface 166a is the same as the inclination angle between the reflecting surface 20b and the lower surface 20a of the reflecting member 20 of the first embodiment.

The reflecting member 166 is disposed between each pair of semiconductor light emitting elements 14 so that the pair of semiconductor light emitting elements 14 adjacent to each other is partitioned. A lower surface 166a adheres to the mounting surface 162a, so that the reflecting member 166 is mounted on the mounting board 162. The kinds of adhesives that may be used are the same as described above. Meanwhile, the reflecting member 166 may be bonded to the mounting board 162 by solder bonding, surface activation bonding, anodic oxidation bonding, or the like. Accordingly, the reflecting member 166 extends from a gap formed between each pair of semiconductor light emitting elements 14 to a gap formed between a pair of optical wavelength conversion members 168, which faces each pair of semiconductor light emitting elements 14, of a plurality of optical wavelength conversion members 168.

In this case, the pair of reflecting surfaces 166c faces the pair of semiconductor light emitting elements 14, which is divided by the reflecting member 166, respectively. The reflecting surface 166c is inclined to be separated from a second light emitting surface 14b of one semiconductor light emitting element 14 as approaching the incident surface 168a of the optical wavelength conversion member 168.

The reflecting member 166 is formed to protrude from both the emission surfaces 168b of the pair of optical wavelength conversion members 168 that is divided by the reflecting member 166. The height of a protruding portion of the reflecting member 166, that is, a protrusion height H9 between the emission surface 168b of the optical wavelength conversion member 168 and an upper surface 166b of the reflecting member 166 is in a range of about 5 to 200 µm. Here, for the easy handling of the light emitting module 160, mechanical strength is required even at the protruding portion of the reflecting member.

For this purpose, the reflecting member 166 includes a pair of vertical surfaces 166d. A pair of vertical surfaces 166d borders the upper ends of the pair of reflecting surfaces 166c, respectively, and extends up to the upper surface 166b of the reflecting member 166 so as to be perpendicular to the first light emitting surface 14a, which face the semiconductor light emitting element, at a position above the incident surface 168a of the optical wavelength conversion member 168. The upper surface 166b is formed in the shape of a plane parallel to the lower surface 166a. The width W2 of the upper surface 166b is set in a range of about 5 to 100 µm. It may be possible to increase the mechanical strength of the reflecting member 166 by avoiding the formation of an acute-angled apex at the portion of the reflecting member 166, which protrudes from the emission surface 168b of the optical wavelength conversion member 168, as described above.

Further, if the vertical surfaces 164d and 166d facing the side surfaces 168c of the optical wavelength conversion members 168 are formed perpendicular to the first light emitting surface 14a, it may be possible to make the side surfaces 168c of the optical wavelength conversion members 168 be perpendicular to the incident surface 168a and the emission surface 168b. Accordingly, it may be possible to avoid the complexity of a process for forming the optical wavelength conversion member 168 by dies or a process for placing the optical wavelength conversion member 168 on the semiconductor light emitting element 14, and to suppress the increase in manufacturing costs.

Furthermore, the reflecting member 164 also includes vertical surfaces 164d at the portions thereof that protrude upward from the emission surface 168b of the optical wavelength conversion member 168. The reflecting member 164 is formed to have the same shape as that of the reflecting member 18 of the first embodiment except for the vertical surfaces. Accordingly, the reflecting member 164 is placed on the mounting surface 162a of the mounting board 162 so as to surround all of the plurality of the semiconductor light emitting elements 14. A lower surface 164a of the reflecting member 164 adheres to the mounting surface 162a, so that the reflecting member 164 is fixed to the mounting board 162. The kinds of adhesives that may be used are the same as described above. Meanwhile, the reflecting member 164 may be bonded to the mounting board 162 by solder bonding, surface activation bonding, anodic oxidation bonding, or the like.

The reflecting surface 164c is the same as the reflecting surface 18c of the first embodiment in that the reflecting surfaces 164c face the second light emitting surfaces 14b except for the second light emitting surfaces 14b facing each other, among the respective second light emitting surfaces 14b of the plurality of semiconductor light emitting elements 14 arranged in a line. Moreover, the reflecting surface 164c is also the same as the reflecting surface 18c of the first embodiment in that the reflecting surface 164c is inclined to be separated from the second light emitting surface 14b facing the reflecting surface as approaching the incident surface 168a of the optical wavelength conversion member 168.

The vertical surface 164d borders an upper end of the reflecting surface 164c, and extends perpendicular to the mounting surface 162a at a position above the emission surface 168b of the optical wavelength conversion member 168. Accordingly, it may also be possible to suppress the decrease of the width of the upper portion of the reflecting member 164 and to increase the mechanical strength of the reflecting member 164. In this case, the vertical surface may be formed so that a value, which is obtained by subtracting the height of the vertical surface from the non-light emitting region height H2, is in a range of 0 to about 30 μm.

The reflecting members 164 and 166 are integrally made of silicon. When the reflecting members 164 and 166 are manufactured, first, masking is formed on portions, which correspond to the upper surface 164b of the reflecting member 164 and the upper surfaces 166b of the reflecting members 166, of a flat plate-like substrate made of single-crystalline silicon. Then, dry etching is performed up to a predetermined depth from the side of the substrate on which masking has been formed, so that the vertical surfaces 164d and 166d are formed.

After that, wet etching is performed from the same side of the substrate as described above, so that the reflecting surfaces 164c and 166c are formed. In this way, it may be possible to form the reflecting surfaces 164c and 166c with an inclination angle of about 54.7° between the reflecting surfaces 164c and 166c and the upper surface 164b. After the reflecting surfaces 164c and 166c are formed, the masking is removed. Those skilled in the art will appreciate that the reflecting members 164 and 166 may be made of a material other than silicon.

A reflecting film having a reflectance of 85% or more is formed on the surfaces of the reflecting members 164 and 166 by depositing, for example, aluminum or silver on the surfaces of the reflecting members. In order to achieve the supply of appropriate current, the reflecting film is formed at a portion that is higher than the lower surface 164a of the reflecting member 164 by 5 μm or more and at a portion higher that is than the lower surface 166a of the reflecting member 166 by 5 μm or more.

Meanwhile, the reflecting members 164 and 166 may be made of a material other than silicon. The reflecting member 164 may be formed so that the inclination angle of the reflecting surface 164c with respect to the upper surface 164b is in a range of about 20 to 70°. The reflecting member 166 may be formed so that the inclination angle of the reflecting surface 166c with respect to the upper surface 166b is in the range of about 20 to 70°.

Meanwhile, the reflecting member 164 may include vertical surfaces that border the lower ends of the reflecting surfaces 164c and extend perpendicular to the mounting surface 162a at positions more distant from the optical wavelength conversion member 168 than the reflecting surfaces 164c. Further, the reflecting member 166 may include vertical surfaces that border the lower ends of the reflecting surfaces 166c and extend perpendicular to the mounting surface 162a at positions more distant from the optical wavelength conversion member 168 than the reflecting surface 166c. In this case, the vertical surface may be formed so that a value, which is obtained by subtracting the height of the vertical surface from the non-light emitting region height H2, is in the range of 0 to about 30 μm. Accordingly, it may be possible to suppress the formation of low-luminance portions between the reflecting member 164 and the semiconductor light emitting element 14 or between the reflecting member 166 and the semiconductor light emitting element 14.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

In a certain modification, a light emitting element, which mainly emits ultraviolet light, may be used as a semiconductor light emitting element. Further, an optical wavelength conversion member is formed by stacking a plurality of optical wavelength conversion layers that converts ultraviolet light into light having different colors. For example, an optical wavelength conversion member may be formed by stacking an optical wavelength conversion layer that converts ultraviolet light into blue light, and an optical wavelength conversion layer that converts ultraviolet light into yellow light. Alternatively, an optical wavelength conversion member may be formed by stacking an optical wavelength conversion layer that converts ultraviolet light into blue light, an optical wavelength conversion layer that converts ultraviolet light into green light, and an optical wavelength conversion layer that converts ultraviolet light into red light. It may also be possible to obtain a light emitting module, which emits white light, by forming the semiconductor light emitting element and the optical wavelength conversion member as described above.

Meanwhile, several kinds of phosphors that convert ultraviolet light into light having different colors may be contained in the optical wavelength conversion member. For example, a phosphor that converts ultraviolet light into blue light, and a fluorescent body that converts ultraviolet light into yellow light may be contained in the optical wavelength conversion member. Alternatively, a phosphor that converts ultraviolet light into blue light, a phosphor that converts ultraviolet light into green light, and a phosphor that converts ultraviolet light into red light may be contained in the optical wavelength conversion member. It may also be possible to obtain a light emitting module, which emits white light, by forming the semiconductor light emitting element and the optical wavelength conversion member as described above.

The invention claimed is:
1. A light emitting module comprising:
a plurality of light emitting elements arranged with a distance interposed therebetween,
wherein each of the light emitting elements comprises:
a first light emitting surface; and
second light emitting surfaces bordering the first light emitting surface;
a plurality of optical wavelength conversion members, each of which converts a wavelength of light emitted from the corresponding light emitting element,
wherein each of the optical wavelength conversion members is plate-shaped and is disposed to respectively face each of light emitting elements; and
a reflecting member that extends from a gap between the adjacent light emitting elements to a gap between the adjacent optical wavelength conversion members so as to surround each of the light emitting elements and so as to separate the adjacent light emitting elements,
wherein the reflecting member comprises reflecting surfaces that respectively face the second light emitting surfaces,
wherein each of the reflecting surfaces is inclined such that a distance between the reflecting surface and the second light emitting surface that faces the reflecting surface is gradually increased toward the optical wavelength conversion member.

2. The light emitting module according to claim 1, wherein the reflecting member is made of silicon.

3. The light emitting module according to claim 1, wherein the reflecting member further comprises:

vertical surfaces, each of which borders respective reflecting surfaces and extends in a direction substantially perpendicular to the first light emitting surface such that the optical wavelength conversion member is closer to the reflecting surface than the vertical surface.

4. The light emitting module according to claim 1, wherein an end of the reflecting member protrudes from the optical wavelength conversion members.

5. The light emitting module according to claim 1, wherein each of the optical wavelength conversion members is placed on respective reflecting surfaces of the reflecting members.

* * * * *